United States Patent [19]

Schink

[11] Patent Number: 4,609,867
[45] Date of Patent: Sep. 2, 1986

[54] METHOD FOR MEASURING ELECTRICAL POTENTIALS AT BURIED SOLID STATE MATTER

[75] Inventor: Helmut Schink, Munich, Fed. Rep. of Germany

[73] Assignee: Siemens Aktiengesellschaft, Berlin & Munich, Fed. Rep. of Germany

[21] Appl. No.: 513,763

[22] Filed: Jul. 14, 1983

[30] Foreign Application Priority Data

Sep. 22, 1982 [DE] Fed. Rep. of Germany ....... 3235100

[51] Int. Cl.[4] .............................................. G01R 31/26
[52] U.S. Cl. ................................. 324/158 D; 250/310; 324/158 R
[58] Field of Search ................. 324/71.3, 71.6, 158 D, 324/158 T, 158 R; 250/396, 427, 423 F, 310, 398, 399; 365/118; 357/29

[56] References Cited

U.S. PATENT DOCUMENTS

| 3,373,353 | 3/1968 | Harris | 324/71.3 |
| 3,882,391 | 5/1975 | Liles | 324/158 R |
| 4,212,082 | 7/1980 | Barber | 365/118 |
| 4,296,372 | 10/1981 | Feuerbaum | 324/71.3 |
| 4,464,627 | 8/1984 | Munakata | 324/158 D |

Primary Examiner—Michael J. Tokar
Attorney, Agent, or Firm—Hill, Van Santen, Steadman & Simpson

[57] ABSTRACT

A method is provided for measuring electrical potentials at solid state matter wherein an ionizing radiation is directed against a measuring point at the surface, whereby a conductive connection between the measuring point at the surface and a measuring point at the solid state matter is produced, its electrical potential to be measured. Electrical potentials are measured at a solid state substance even when the solid state matter is hidden beneath at least one conductive layer and at least one insulating layer. The electrical potential at the solid state matter is identified by measuring induced specimen current.

2 Claims, 4 Drawing Figures

METHOD FOR MEASURING ELECTRICAL POTENTIALS AT BURIED SOLID STATE MATTER

BACKGROUND OF THE INVENTION

1. Field of the Invention

The present invention relates to a method for measuring electrical potentials, and more particularly to a method for measuring electrical potentials at solid state matter which is separated from a surface by at least one conductive layer and at least one insulating layer wherein ionizing radiation is directed against a measuring point at the surface.

2. Description of the Prior Art

Electrical potentials of solid state matter which are hidden below an insulating layer and a conductive cover layer such as, for example, potentials under the gate electrode of a metal-oxide-semiconductor (MOS) structure or, for example, potentials of a hidden path within a multi-layer wiring are to be measured topically resolved and in a non-destructive manner.

When only an insulating cover layer is located at the surface of a specimen, then, based on the knowledge in this art, a potential measurement at a solid state matter which is hidden beneath the cover layer is possible in a scanning electron microscope with the assistance of a known method of potential contrast when the primary beam energy is sufficiently high as to form a conductive channel in the entire thickness of the insulating cover layer. This known method fails, however, when the insulating layer is, in turn, additionally covered by a conductive cover layer. In order to measure the potential at a solid state substance which is covered under at least one conductive layer and at least one insulating layer, therefore, the layers lying thereabove previously had to be eroded.

SUMMARY OF THE INVENTION

The object of the present invention, therefore, is to provide a method of the type generally set forth above with which electrical potentials at a solid state substance can also be measured when the solid state matter is buried beneath at least one conductive layer and at least one insulating layer.

According to the invention, the above object is achieved for measuring electrical potentials at solid state matter which is separated from a surface by at least one conductive layer and at least one insulating layer, wherein ionizing radiation is directed against a measuring point at the surface, and whereby a conductive connection between the measuring point at the surface and a measuring point at the solid state matter is produced, and in which the method is characterized in that the electrical potential is identified by way of measuring the current induced in the specimen.

The method of the invention is based on the fact that the current induced in an insulating layer, for example a gate oxide, by ionizing radiation depends on the voltage applied to the insulating layer, for example, between the gate electrode and the substrate. With the method of the invention, for example, in a scanning electron microscope, a pn junction below a gate electrode can even be localized at a MOS structure when no inverse voltage is applied to the pn junction. It can thereby be demonstrated with the method of the invention that the signal width at this pn junction linearly increases with an applied inverse voltage. A topical resolution of 0.1 $\mu$m and a potential resolution of 0.1 V can be specified on the basis of experiments currently existing. Electrical inhomogeneities, for example, at the boundary surface of substrate/oxide, in the semiconductor components can also be localized and measured with the method of the invention.

BRIEF DESCRIPTION OF THE DRAWINGS

Other objects, features and advantages of the invention, its organization, construction and operation will be best understood from the following detailed description, taken in conjunction with the accompanying drawings, on which.

DESCRIPTION OF THE PREFERRED EMBODIMENTS

Figure 1:
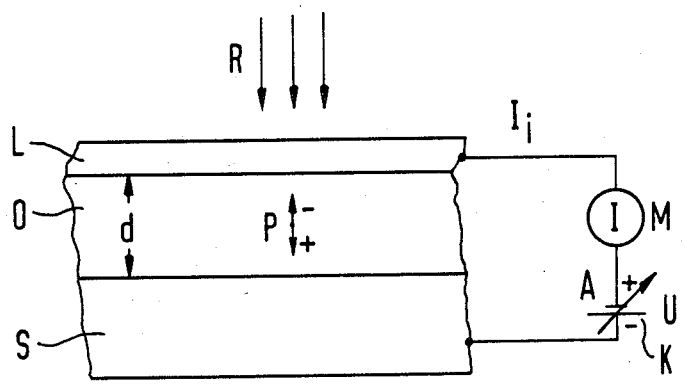
FIG. 1 is a schematic illustration of a test installation for practicing the present invention.

FIG. 1 is a schematic illustration of a test installation for practicing the present invention. Pairs of charge carriers P are generated in an insulating layer O by means of ionizing radiation R, for example, electron beams, X-rays, light, etc. When a field $E=U/d$ is applied to an insulating layer O having a thickness d, then the charge carrier pairs P are separated, the electrons migrate to an anode A and the holes migrate to a cathode K. In FIG. 1, the field $E=U/d$ is applied, for example, between a substrate S and a conductive cover layer L. A path l which the charge carriers of the charge carrier pairs traverse with a mobility $\mu$ during the life span $\tau$ depends on the field strength E as long as l<d:

$$l=\mu\tau E.$$

A current pulse having the duration $\tau$ and the magnitude $\Delta I$ occurs in the external circuit per charge carrier of a charge carrier pair P:

$$I=cv/d=e\mu U/d^2$$

where e is an elemental charge and v is the drift velocity.

When n charge carriers are generated per unit of time via the separation of charge carrier pairs P, then, on average, induced current occurs at:

$$I_i=n\tau\Delta I=ne\mu U/d^2.$$

One can therefore see that the induced current $I_i$ is a measure for the potential difference U applied between the substrate S and the conductive cover layer L. The induced current $I_i$ is measured with the measuring device M.

Figure 2:
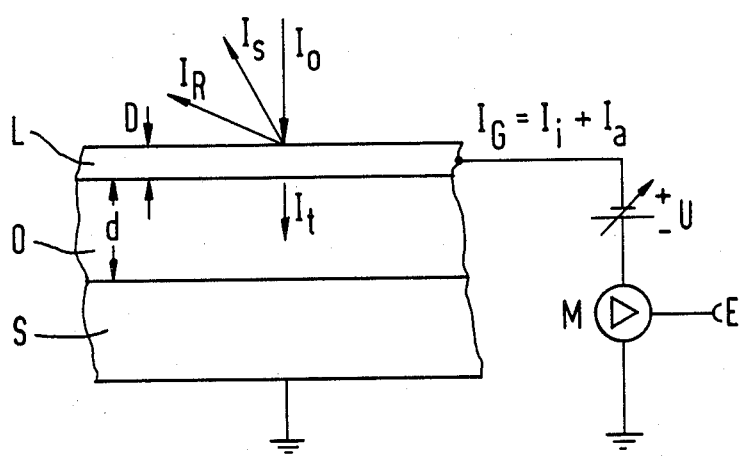
FIG. 2 is a schematic illustration of a test installation for practicing the present invention in a scanning electron microscope.

FIG. 2 illustrates a test installation for the method of the invention as applied to a scanning microscope. For calculating a current $I_i$ (electron beam induced current EBIC) induced by an electron beam R, one proceeds in a simplified manner such that the overall primary electron current transmitted through the conductive cover layer L $$I_i = (1-\epsilon)I_o,$$

where $\epsilon$ is a portion of the electrons absorbed in the cover layer L, is absorbed in the insulator layer and generates charge carriers having a density which is constant over a thickness d of the insulating layer O. With g being the plurality of charge carriers generated per incident electron, then $$n = I_i g/e = g(1-\epsilon)I_o/e.$$

Thus deriving therefrom is an incident current $I_i$ of $$I_i = I_o g(1-\epsilon)\tau\mu U/d^2.$$

A further current $I_a$ flowing from the conductive cover layer L is superimposed on the induced current $I_i$ in the external circuit. This departing current $I_a$ is calculated as follows. The current $\epsilon I_o$ is that portion of the primary electron current $I_o$ which does not pass the conductive cover layer L. This current component not passing the conductive cover layer L is composed of the backscatter electron current $I_R = \eta I_o$, where $\eta$ is the backscatter coefficient, of the secondary electron current $I_S = \delta I_o$, where $\delta$ is the secondary electron yield, and the current $I_a$ flowing over the external circuit. It therefore follows that $$I_a = \epsilon I_o - I_R - I_S = (\epsilon - \sigma)I_o$$

where $\sigma = \eta + \delta$.

When a voltage U is applied between the conductive layer L and the substrate S, the overall current $I_G$ measurable in the measuring device M thus amounts to:

$$I_G = I_a + I_i = (\epsilon - \sigma)I_o + (1-\epsilon)g\tau\mu I_o U/d^2.$$

This measurable overall current $I_g$ contains a portion which is dependent on the voltage U, namely the departing current $I_a$ and a portion which is linearly dependent on the voltage U, namely the induced current $I_i$. The measured signal for the overall current $I_g$ can be made visible at a video screen by way of a terminal E.

Figure 3:
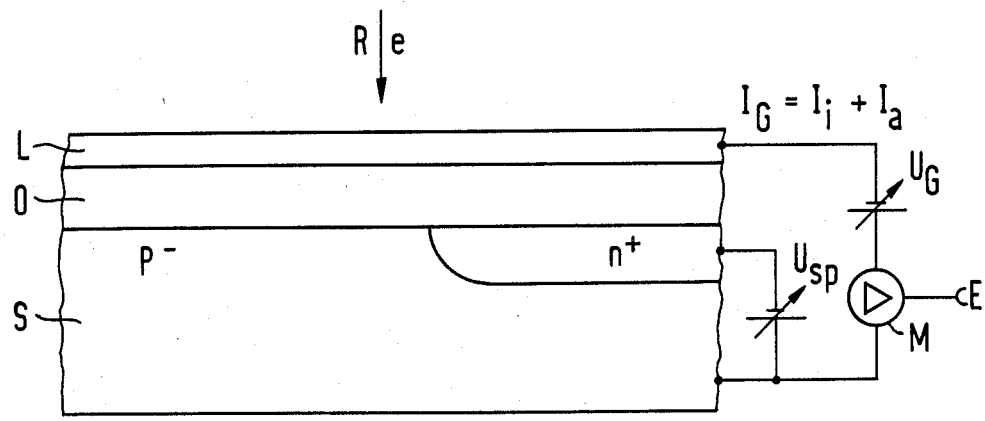
FIG. 3 is a schematic illustration of a test installation for practicing the method of the invention at a MOS structure having a pn junction in the substrate.

FIG. 3 illustrates a test installation for the method of the invention with which a pn junction in a MOS structure can be localized. The topical resolution for the potential measurement by way of electron beam induced current (EBIC) depends on the diameter $d_o$ of the primary electron beam R and on its spread $\Delta x$ in the conductive layer L and in the insulating layer O. Given 2.5 kV acceleration voltage for the primary electron beam R and a beam current $I_o$ of $10^{-9}$ A, a beam diameter of the primary electron beam R of $d_o \approx 0.15$ $\mu$m can be achieved with standard tungsten hairpin cathodes.

The beam spread $\Delta x$ approximately corresponds to the penetration depth of the primary electron beam R into a solid body and the penetration depth amounts to approximately 0.15 $\mu$m for 2.5 kV electrons in aluminum Al, silicon Si and silicon dioxide $SiO_2$. Given an arrangement according to FIG. 3 in which the conductive cover layer L comprises aluminum AL, the insulating layer O consists of silicon dioxide $SiO_2$, and the substrate consists of silicon Si, one can count on a resolution of approximately 0.3 $\mu$m. An influence of the charge carrier diffusion length l, which amounts to approximately $10^{-2}$ $\mu$m for electrons in silicon dioxide $SiO_2$, can be neglected in comparison thereto.

When a solid state structure of the type illustrated in FIG. 3 is scanned in a scanning electron microscope, then the pn junction in the substrate S can be localized from the signal curve for the measurable overall current $I_G$ in the measuring device M and conclusions can be drawn concerning the potentials existing at the surface of the substrate S.

Figure 4:
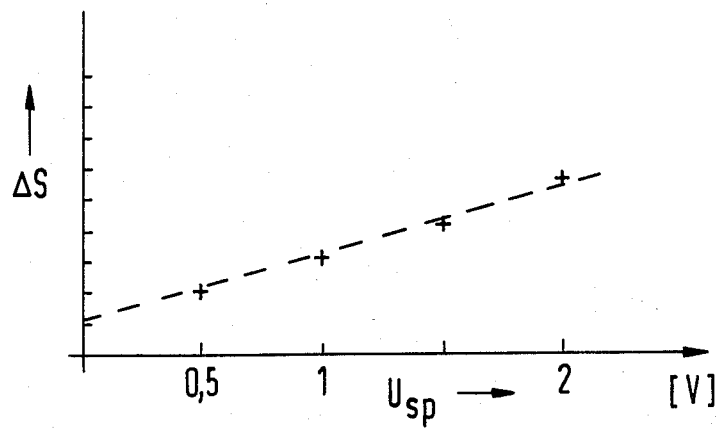
FIG. 4 is a graphic illustration of the signal change as a function of the inverse voltage applied to the pn junction of FIG. 3.

FIG. 4 illustrates the result of such a measurement. FIG. 4 illustrates the signal change $\Delta S$ as a function of the inverse voltage $U_{sp}$ applied to the pn junction in the substrate S. Regions which are doped n+ are implanted and have a depth of approximately 0.3 $\mu$m in the p silicon substrate S of FIG. 3, which exhibits a resistance of 10 $\Omega$cm. The substrate S is coated over its entire surface with 100 $\mu$nm high-temperature oxide $SiO_2$ and with 330 Å aluminum Al. One and the same line across the pn junction can be scanned at various inverse voltages $U_{sp}$ with the primary electron beam R. The voltage $U_G$ applied between the substrate S and the conductive cover layer L amounts to, for example, $-9$ V. The curves deriving from the line scannings by the electron beam scanning supply the signal sweep $\Delta S$ at the pn junction as a function of the inverse voltage $U_{sp}$ applied to the pn junction. This signal sweep $\Delta S$ produces the anticipated, linear dependency on the inverse voltage $U_{sp}$ illustrated in FIG. 4. The signal sweep $\Delta S$, given an inverse voltage $U_{sp} = 0$ is produced by the diffusion voltage.

A measuring installation according to FIG. 3 can be calibrated. It is then possible with the method of the invention to measure potentials at solid state matter which is hidden beneath at least one insulating layer and at least one conductive layer. The invention enables the measurement of a voltage between a measuring point which exhibits a conductive connection to a measuring point at the conductive channel induced by the radiation R and a measuring point whose potential exhibits a defined relationship to the measuring point at the solid state matter.

Although I have disclosed my invention by reference to particular illustrative embodiments thereof, many changes and modifications of the invention may become apparent to those skilled in the art without departing from the spirit and scope of the invention. I therefore intend to include within the patent warranted hereon all such changes and modifications as may reasonably and properly be included within the scope of my contribution to the art.

I claim:

1. A method for measuring electrical potentials at solid state matter which is separated from a surface by at least one conductive layer and at least one insulating layer, comprising the steps of:

directing an ionizing beam against a measuring point at the surface to produce a conductive connection between the measuring point at the surface and a measuring point at the solid state matter and establishing potential between the conductive layer at the solid state matter;

contemporaneously inducing and measuring specimen current by the application of the ionizing beam; and measuring the electrical potential of the measuring location on the solid state matter in response to the measured specimen current which is linearly dependent on the difference in potential between the conductive layer and the measuring location on the solid state substance.

2. The improved method of claim 1, and further comprising the step of:

localizing and measuring electrical inhomogeneities at the solid state matter.

* * * * *